(12) United States Patent
Okulan

(10) Patent No.: US 10,879,449 B2
(45) Date of Patent: Dec. 29, 2020

(54) SEMICONDUCTOR STRAIN GAUGE AND METHOD OF MANUFACTURING SAME

(71) Applicant: Nihat Okulan, Los Angeles, CA (US)

(72) Inventor: Nihat Okulan, Los Angeles, CA (US)

( * ) Notice: Subject to any disclaimer, the term of this patent is extended or adjusted under 35 U.S.C. 154(b) by 0 days.

(21) Appl. No.: 15/592,796

(22) Filed: May 11, 2017

(65) Prior Publication Data

US 2019/0383677 A1    Dec. 19, 2019

(51) Int. Cl.
| | |
|---|---|
| *H01L 41/22* | (2013.01) |
| *G01L 1/18* | (2006.01) |
| *G01L 1/22* | (2006.01) |
| *H01L 41/047* | (2006.01) |
| *H01L 41/08* | (2006.01) |
| *H01L 41/04* | (2006.01) |

(52) U.S. Cl.
CPC ............... *H01L 41/22* (2013.01); *G01L 1/18* (2013.01); *G01L 1/2293* (2013.01); *H01L 41/04* (2013.01); *H01L 41/047* (2013.01); *H01L 41/0471* (2013.01); *H01L 41/0472* (2013.01); *H01L 41/08* (2013.01); *H01L 41/0805* (2013.01)

(58) Field of Classification Search
CPC ......... G01L 1/2293; G01L 1/18; H01L 41/04; H01L 41/047; H01L 41/0471; H01L 41/0472; H01L 41/08; H01L 41/0805; H01L 41/22
See application file for complete search history.

(56) References Cited

U.S. PATENT DOCUMENTS

| | | | |
|---|---|---|---|
| 5,145,810 A * | 9/1992 | Matsumi ............. | B81C 1/00246 438/53 |
| 2001/0025529 A1* | 10/2001 | Murata ............... | G01C 19/5719 73/514.16 |
| 2001/0042298 A1* | 11/2001 | Katsuda ............... | B60R 21/2644 29/463 |
| 2002/0050596 A1* | 5/2002 | Otsuka ................... | H01S 5/0422 257/81 |
| 2009/0194827 A1* | 8/2009 | Ogino ................. | G01P 15/0802 257/415 |
| 2009/0223299 A1* | 9/2009 | Kotovsky .................. | G01L 1/18 73/777 |
| 2017/0113925 A1* | 4/2017 | Rey ........................ | B81C 1/0023 |

* cited by examiner

*Primary Examiner* — Feifei Yeung Lopez
(74) *Attorney, Agent, or Firm* — Select Patents; Ashkon Cyrus

(57) ABSTRACT

Semiconductor strain gages fabricated on Silicon-on-insulator (SOI) material, and the method of making them. Force sensing elements are uniformly batch-fabricated at wafer level and singulated individually by a wire bonding method. In another method, they are singulated by plucking them off the wafer from their attachment site.

1 Claim, 6 Drawing Sheets

SEMICONDUCTOR STRAIN GAUGE AND METHOD OF MANUFACTURING SAME

FIELD OF THE INVENTION

The present invention relates to semiconductor strain gages. More particularly, the present invention relates to semiconductor strain gages fabricated on Silicon-on-insulator (SOI) material, and the method of making such gages.

BACKGROUND OF THE INVENTION

Objects subject to external forces undergo strain. In numerous circumstances, it is desirable to know the strain a particular object is experiencing in order to preserve the structural integrity of the object, and/or the overall device of which the object is a part. Examples include automobile parts, airplane parts, highway and bridge components, railway components and components of devices used in the aerospace industry.

An object experiencing strain will typically experience a deformation in its shape. Strain gages serve to measure such strain, by measuring the deformation of the object. Strain gages are typically bonded to the objects in order to best detect changes in physical property of the object.

An ideal strain gage will be small such that it does not add to the bulk of the device. In addition, an ideal strain gage will not undergo physical changes itself and/or will not have its performance altered as a result of temperature variations or other environmental variations.

Semiconductors are commonly used as strain gages as they are sensitive to many physical and electrical effects and signals. Semiconductor strain gages depend on the piezoresistive effects of silicon or germanium. As an electrical conductor is stretched, it becomes longer and narrower, thus increasing its resistance. This piezoresistance effect is used as a measure of applied stress.

Semiconductor strain gages consist, in general, of a thin and strain sensitive crystal element that has leads attached to it to measure resistance change. They offer many advantages to conventional foil gages and metal wires, such as smaller size, higher sensitivities, and higher resistance values.

Many of the currently available strain gages are based on bulk single crystal silicon, utilizing conventional etching and photolithography. Batch fabrication of sensors based on silicon is nowadays very cost efficient. For example, thousands of sensors can be micro-fabricated on one silicon wafer. The reduced fabrication cost allows those sensors to be implemented onto devices that were too expensive to be monitored in the past. Further, the reduction in sensor size increases the numbers of sensors that can be fabricated in one batch. However, the post fabrication and packaging steps become more complicated because smaller sensors are more difficult to handle.

Moreover, the performance and resistance change of strain gages depend immensely on the thickness of the gage. The current methods of bulk manufacturing strain gages present a major disadvantage in achieving a uniform thickness of sensors across a given wafer, resulting in higher yield loss and cost. The thickness of the fabricated gages is highly dependent on the uniformity of the etching process used in the formation of the sensors. One drawback of currently available strain gages is that when conventional manufacturing techniques are applied, the uniformity in thickness is in general poor across the wafer.

In addition, that performance and resistance change of strain gages also depends strongly on dimensional variations on the wafer, such as different exposed etch areas. Considering that the sensor thickness relies upon the thinning of a silicon substrate that could be up to 300 times the desired thickness, the achieved resistance value of the gage can easily vary by 30% or more. Furthermore, once the sensors are fabricated on a wafer, the singulation of individual sensors is difficult because of their small size. Current methods require picking individual sensors out of a solution, which is difficult and time consuming.

What is required is a semiconductor strain gage with a method to precisely control the gage thickness, resulting in improved strain gage resistance uniformity. Further, an easy way for post fabrication handling and packaging of singulated strain gages is needed.

SUMMARY OF THE INVENTION

The current invention addresses the foregoing issues and drawbacks. In one embodiment, the current invention consists of strain gages with an electrically resistive device layer and contact pads that measure dynamic and static strain. The present invention also provides a method of manufacturing such device on a wafer in a uniform manner, and a method of freeing such device from substrates for post-manufacturing processing.

The wafer is preferably comprised of silicon, which takes advantage of the piezoresistive characteristic of semiconductors. The strain gages are preferably fabricated on pre-doped Silicon-On-Insulator (SOI) wafers, wherein the device layer thickness and handle wafer thickness is precisely controlled by wafer manufacturers.

In one preferred embodiment, the strain gages are first lithographically fabricated on the device layer. This can be followed by wire bonding the gages and then singulating the gages by etching the handle wafer without attacking the gages on the device layer.

In another preferred embodiment of this invention, the strain gages are first lithographically fabricated on the device layer. The gages are designed to be attached to the frame after the release etch. In this way the gages can be plucked from the wafer for post fabrication handling and packaging.

BRIEF DESCRIPTION OF DRAWINGS

The reasoning and advantages of this invention will appear clearer when considering the detailed descriptions in connection with the figures. These drawings are not to scale and are for the purpose of concept illustration. For example, the thickness and width of the device layer in some figures are purposely enhanced to illustrate sensor characteristics, such as active sensing area and connecting pads, compared to the sacrificial handle wafer.

DETAILED DESCRIPTION OF THE INVENTION

Figure 1B:
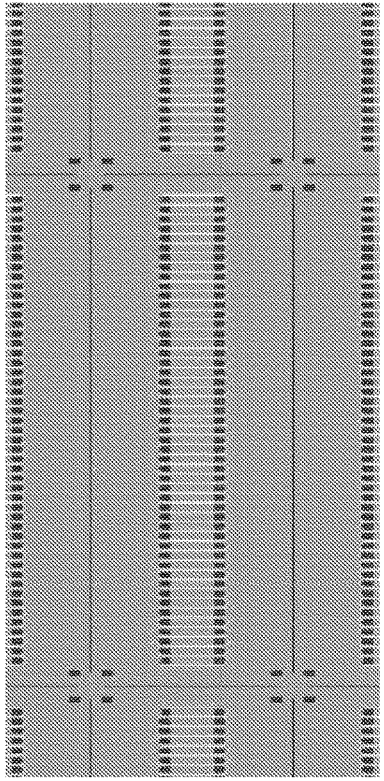
FIG. 1B shows a zoomed in drawing identifying several dies.

The current invention is now described with reference to the figures. Components appearing in more than one figure bear the same reference numerals.

Preferred embodiments of the present invention are described herein. Other variations of the present invention may also be performed and are claimed in the present patent, as referenced herein. The invention is described in combination with particular embodiments, but it is not the intention to limit the invention to the described embodiments. Rather, it is intended to encompass alternatives, equivalents and modifications as described by the scope of the presented claims.

Typically, when fabricating semiconductor devices, many devices are fabricated on one wafer. As devices become smaller, and thus typically cheaper, it becomes more difficult to free the devices from the wafer in a clean and high yielding way once the fabrication is finished. This invention describes a method of making high yielding semiconductor strain gages and methods to free them from the wafer for post packaging and handling.

Figure 1A:
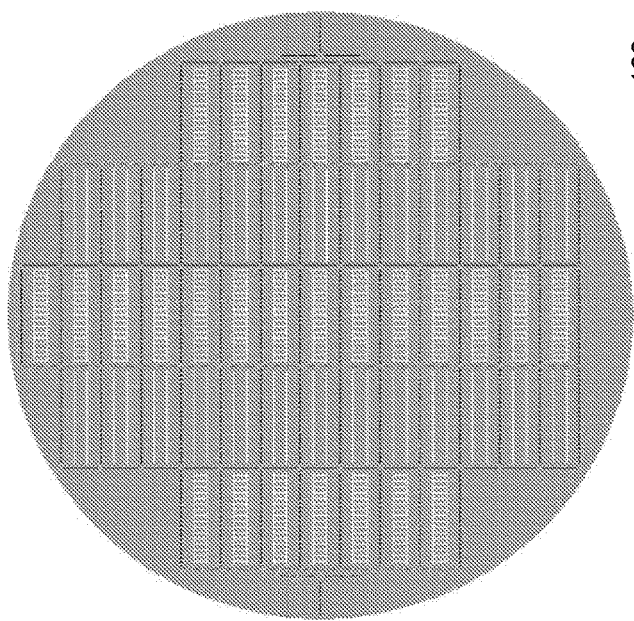
FIG. 1A shows a perspective view of a SOI wafer that is holding thousands of strain gages.

FIG. 1A shows a perspective view of a SOI wafer that is holding thousands of strain gages.

FIG. 1B shows a zoomed in drawing identifying several dies. These dies are separate clusters of strain gages.

Figure 1D:
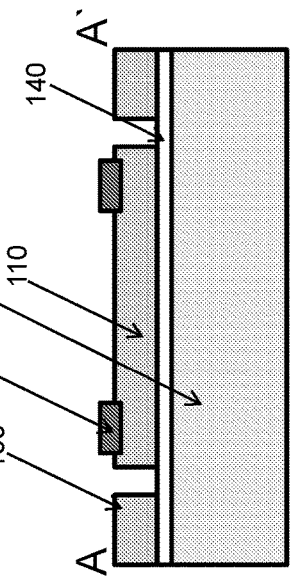
FIG. 1D shows a cross-sectional view of a preferred embodiment of this invention.
Figure 1C:
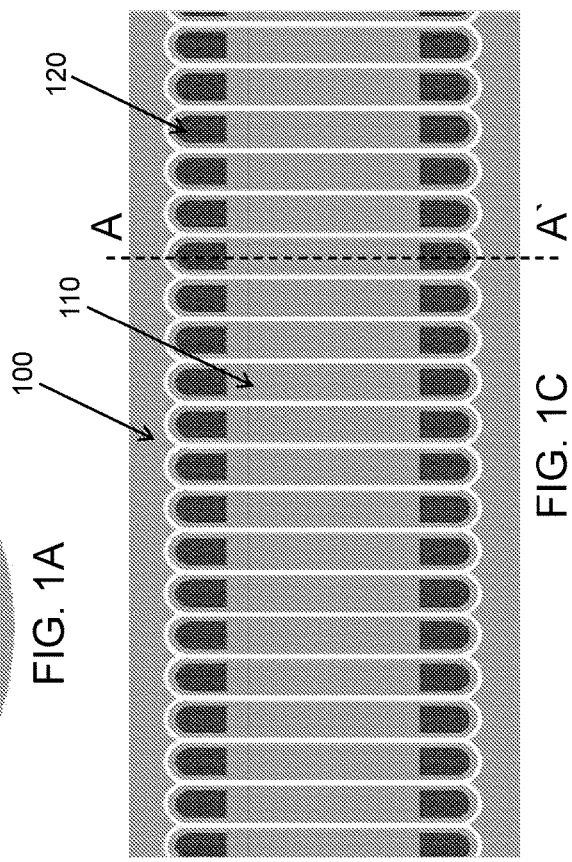
FIG. 1C illustrates a further zoomed in version of the wafer, indicating several parts of a given die.

FIG. 1C illustrates a further zoomed in version of the wafer, indicating several parts of a given die.

FIG. 1D shows a cross-sectional view of a preferred embodiment of this invention. The reactive part of the strain gage 110 is made out of the device layer of the SOI wafer. It sits on top of the buried oxide (BOX) layer 140 and the carrier wafer 130. These two pieces of the invention and the frame 100 are essential in the fabrication process and will be described herein in detail.

Metallic interconnects 120 are formed on the reactive part of the strain gage and are needed to gather an electrical signal that is proportional to the stress applied to the gages. Electrical wires are attached to those interconnections, or pads, of the gage in order to connect the gage to e.g. supporting electronics.

Figure 2A:
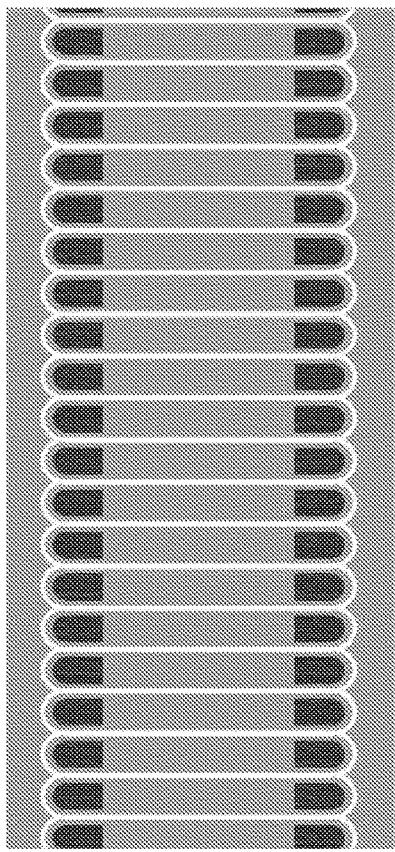
FIGS. 2A-2C show different possible designs of strain gages packed on dies.

FIG. 2A shows one possible design of strain gages. This design type is a straight gage with two metallic connection pads on the opposing ends.

Figure 2B:
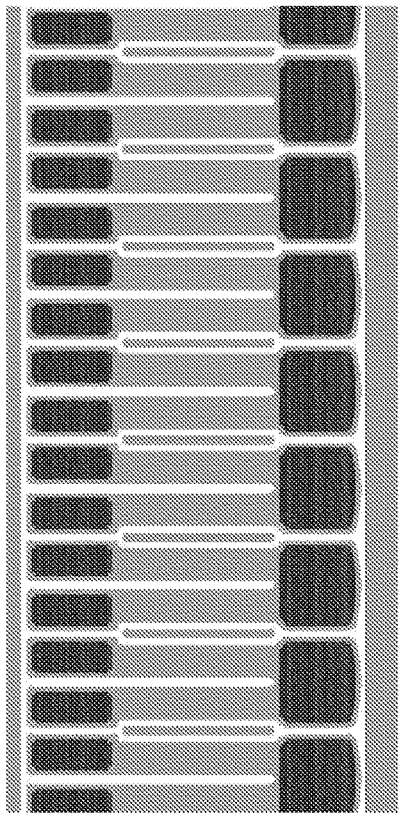

FIG. 2B shows another possible design of strain gages. This type is a U-shaped design. This type of strain gage can be used if there is a desire to keep the electrical contacts away from the stressible part of the object to be measured. For example, the U-shaped sensor can be attached to a diaphragm of a pressure sensor in such a way that only the reactive part of the gage is exposed and attached to the flexible part of the diaphragm, and where the electrical contacts are kept outside the diaphragm area.

Figure 2C:
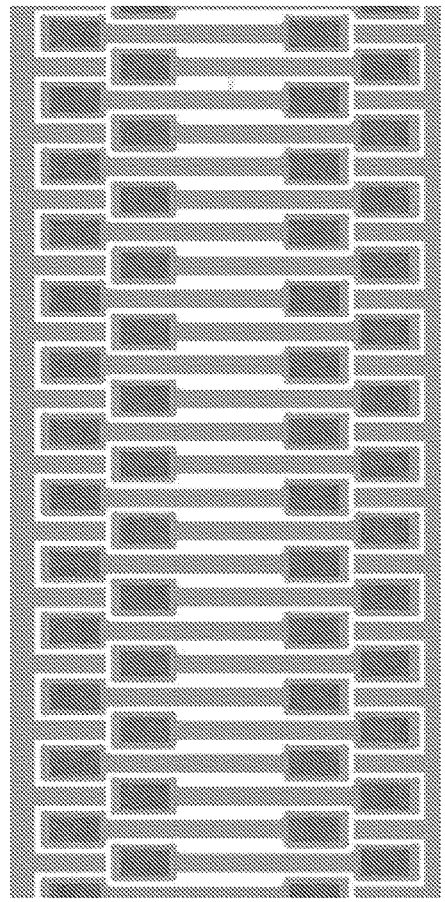

FIG. 2C show another straight gage design, packed differently on a die as compared to the embodiment depicted in FIG. 2A.

The gages depicted in FIG. 2 are preferred embodiments of the present invention, and as such, illustrate possible designs of strain gages of the present invention. However, the present invention is not limited to the depicted embodiments. All of depicted embodiments are made from the device layer of a SOI wafer, with at least two metal connections.

Figure 3A:
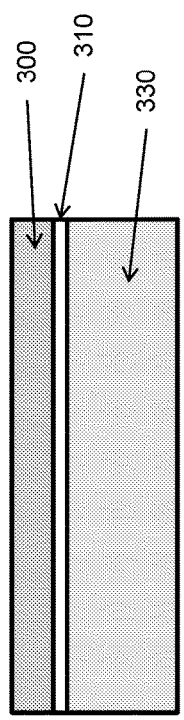
FIGS. 3A-3D show fabrication steps of strain gages made out of the device layer of a SOI wafer, in one embodiment of the device of the present invention.

FIG. 3A depicts the starting material for making the strain gages. The SOI wafer shown consists of a device layer 300 with a typical, although not required, thickness of 10 um. This thickness is essential in attaining the target resistance value of the strain gage and thus a high yielding gage production. The target resistance value is inversely proportional to the device layer thickness. If, for example, a desired target resistance of 10 kOhm requires a thickness of say 10 um and a maximum allowable variation of +/−500 Ohm, the thickness cannot vary more than +/−0.5 um. The device layer thickness can be precisely controlled by the wafer manufacturer, such as SOITEC or ULTRASIL, and the variation can be specified to be less than 5 percent. The buried oxide layer 310 (BOX) separates the device layer from the carrier wafer 330 and serves as an etch stop for the gage fabrication and the release process.

Figure 3B:
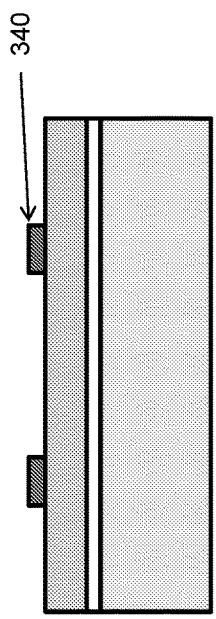

FIG. 3B shows lithographically formed metallic interconnects between the strain gage and the environment. A typical metallic pad 340 may be aluminum, however, other materials may also be employed. A typical thickness is approximately 1 um. The metallic pad may be patterned on the device layer by a standard wet etch or a lift-off technique.

Figure 3C:
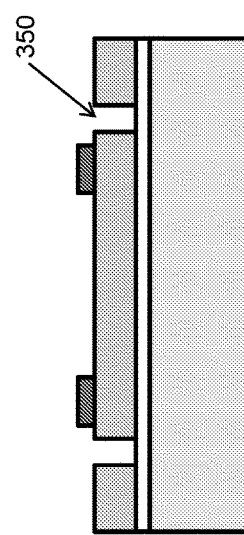

FIG. 3C shows a trench 350 that has been lithographically formed into the device layer. This trench forms the outline of a strain gage and may be created by a standard wet or dry etch process. The preferred method, although not required, to form this trench is a straight dry etch process, such as the BOSCH etch process.

Figure 3D:
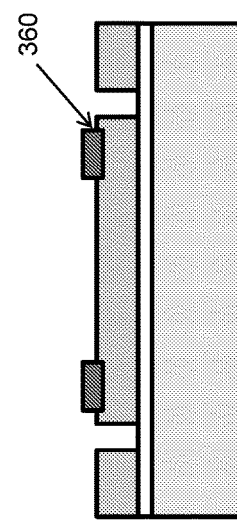

FIG. 3D depicts a sintering process to increase the metal adhesion to the device layer and to form an improved, ohmic contact. The sintering temperature may be anywhere from 200 C to 600 C. The preferred temperature for the use with aluminum is 450 C. When other materials are employed in the place of aluminum, the preferred temperature may differ.

Figure 4A:
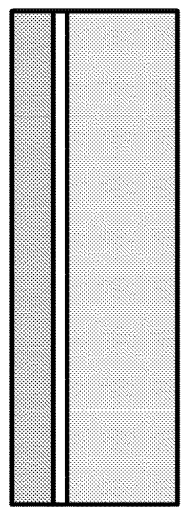
FIGS. 4A-4D illustrate another embodiment in which a different method of fabricating strain gages out of the device layer of a SOI wafer is employed.
Figure 4B:
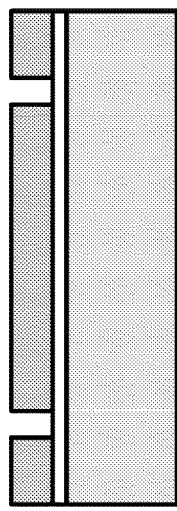

The sequence of images shown in FIGS. 4A to 4D presents an alternative way of fabricating strain gages from the device layer. In this sequence, the trench is patterned before the metal pads are formed. FIG. 4A indicates the starting SOI material, which is identical to that depicted in FIG. 3A. F FIG. 4B shows a trench that has been lithographically formed into the device layer. This trench forms the outline of a strain gage and can be created by a standard wet or dry etch process. The preferred method, although not required, to form this trench is a straight dry etch process, such as the BOSCH etch process.

Figure 4C:
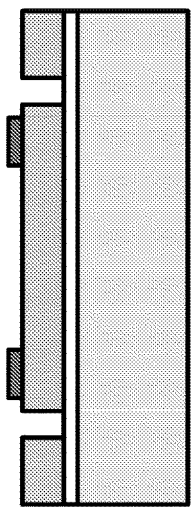

FIG. 4C shows lithographically formed metallic interconnects between the strain gage and the environment. A typical metallic pad can be, although not required, aluminum. A typical thickness in this embodiment may be approximately 1 um. It may be patterned on the device layer by a standard wet etch or a lift-off technique.

Figure 4D:
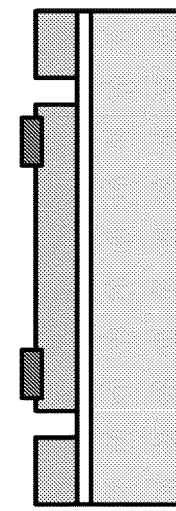

FIG. 4D indicates a sintering process to increase the metal adhesion to the device layer and to form an improved, ohmic contact. The sintering temperature may preferably be anywhere from 200 C to 600 C. The preferred temperature for the use with aluminum is 450 C. When other materials are employed, the preferred temperature may vary.

After the strain gages are formed on the device layer of the SOI wafer, the gages may be released (or freed) from the substrate wafer. The sequence of FIGS. 5A to 5F depict one method of freeing the strain gages. The shown sequence may be performed at wafer level, or the wafer may be diced or cleaved into smaller pieces.

Figure 5A:
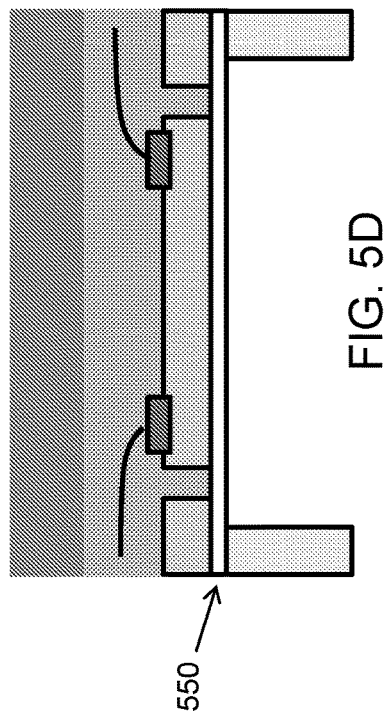
FIGS. 5A-5F illustrate fabrication steps to release strain gages from the substrate wafer in one embodiment of the present invention.

FIG. 5A shows the cross-sectional view of one strain gage after the gages have been fabricated on a device layer of a SOI wafer, as described above. Wires 510 are attached to the pads. This may be done by wire bonding gold or aluminum to the pads. Other methods may alternatively be employed.

Figure 5B:
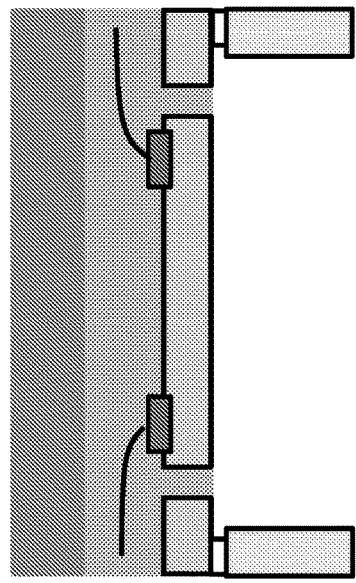
Figure 5C:
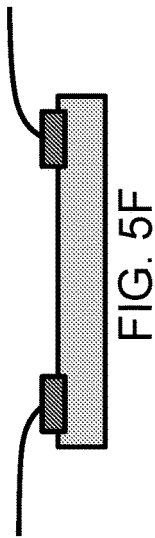

FIG. 5B shows the step of bonding gold or aluminum wires to the pads. In order to protect the strain gages and wires during the release process, the strain gages and wires are passivated and attached to a carrier. One preferred passivation material 520, is black wax from Apiezon. Other materials may alternatively be employed. The passivation material may be melted and attached to a stainless steel plate or any other inert material 530 that is not attacked by the removal process of the SOI handle wafer 540. A typical method, but not limited to this method, is using a wet etchants such as Potassium Hydroxide or HNA mixtures. Those etchants are etching the handle wafer at a rate that is much larger than the etch rate of the BOX 550.

Figure 5D:
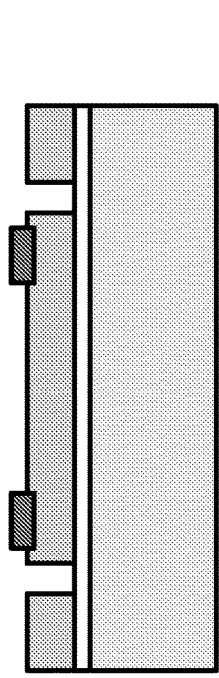
Figure 5E:
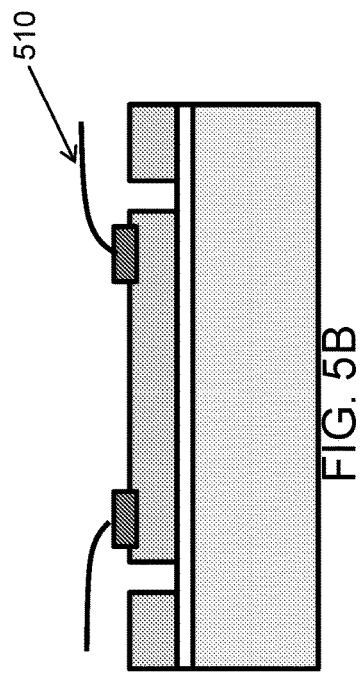
Figure 5F:
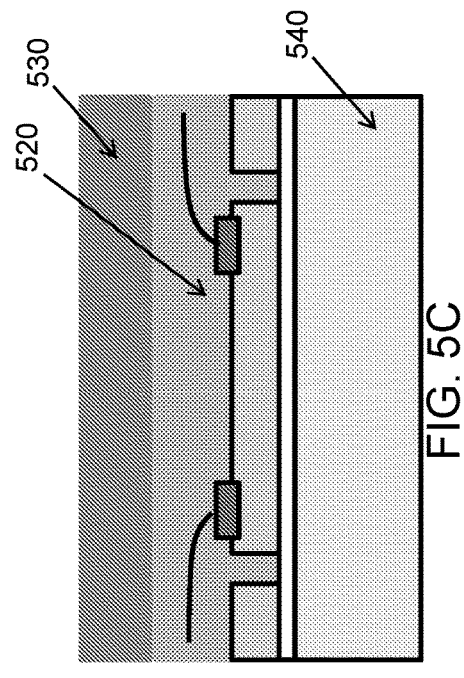

FIG. 5D shows the remaining parts of the gage fabrication after the handle wafer has been etched away. As illustrated in FIG. 5E, the BOX layer may be removed, for example by using a buffered hydrofluoric acid solution, which does not attack the exposed gages. The final step is indicated in FIG. 5F, wherein the gages are freed from the passivation layer and the carrier material. A preferred method is by immersion into solvents, such as Xylene, Acetone and Methanol. Other methods may alternatively be employed.

Another method of making the strain gages and releasing them from the SOI wafer, as covered in this invention, is by designing the strain gages such that they are attached to the frame of the device layer of the SOI wafer. After removing the handle wafer of the SOI wafer, the gages can be plugged from the frame and placed into the desired location.

Figure 6A:
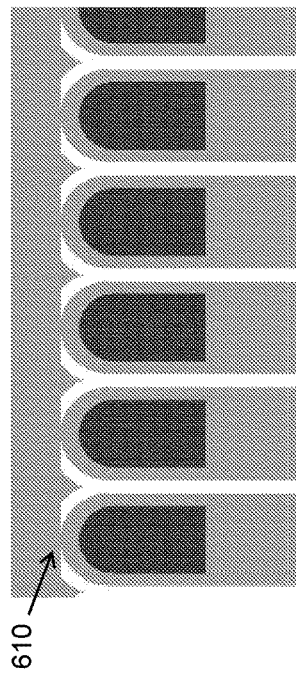
FIGS. 6A-6F illustrate the progression of strain gages fabricated from the device layer of a SOI wafer from wafer level to die level, from die level to individual nonspecific gage. In this embodiment, gages are still attached to the frame and can be plucked from the wafer.
Figure 6B:
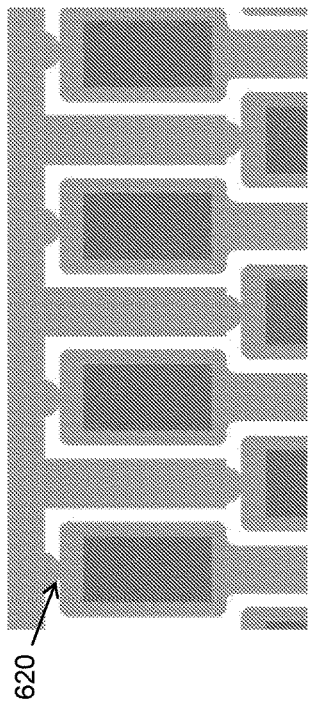
Figure 6C:
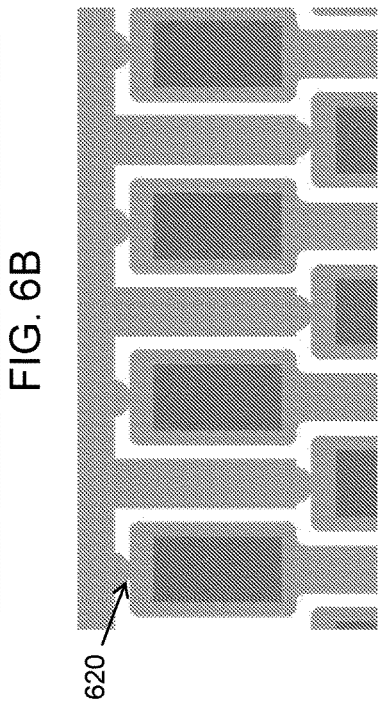
Figure 6D:
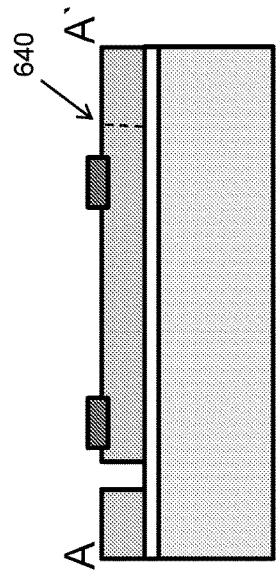
Figure 6E:
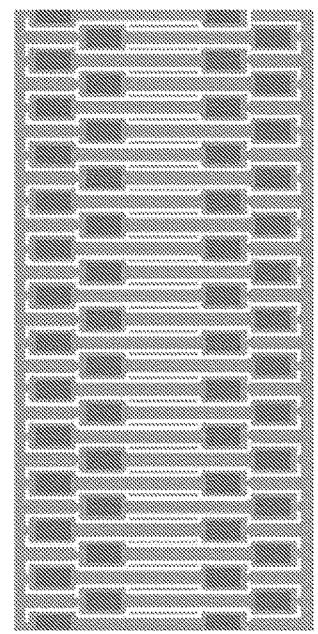
Figure 6F:
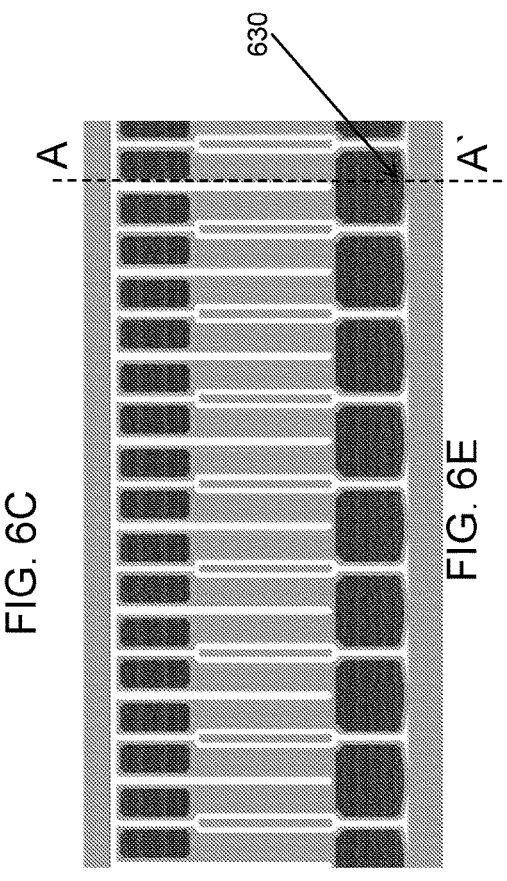

FIGS. 6A and 6B show the design of straight strain gages. As can be seen, the endings of the gages 610 are designed to be attached to the frame. FIGS. 6C and 6D show another way of attaching previously mentioned gages. Those gages are designed such that they are attached to the frame via frame extensions 620. Another way, 630, of attaching previously described gages is indicated in FIG. 6E. The method of making those gages on the device layer of a SOI wafer is identical as to the way described in FIGS. 3 and/or FIG. 4. The cross-sectional view can be seen in FIG. 6F. As described earlier, the strain gages are lithographically fabricated from the device layer of an SOI wafer. However, in comparison with FIG. 3D, at least one end of the gage 640 is attached to the frame.

Figure 7D:
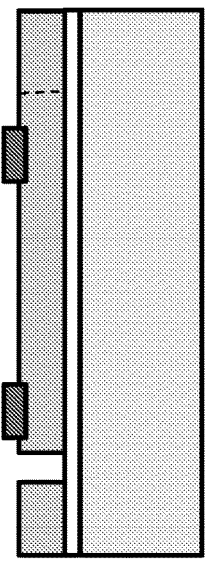
FIGS. 7A-7F illustrate steps taken in order to release strain gages from the substrate wafer in one embodiment of the present invention. In this embodiment, gages are still attached to the frame to be plucked out from the wafer.
Figure 7E:
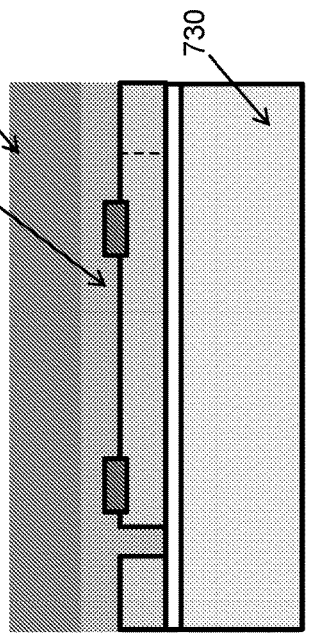
Figure 7F:
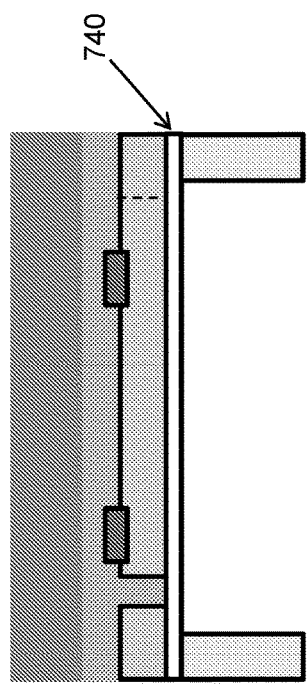
Figure 7A:
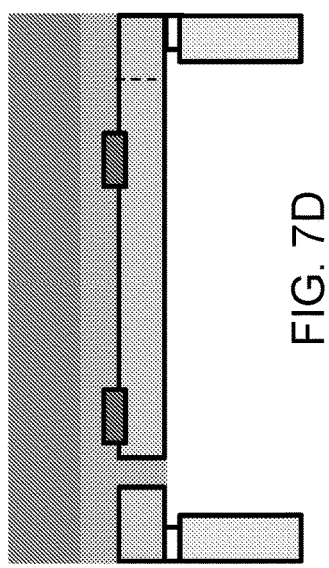
Figure 7B:
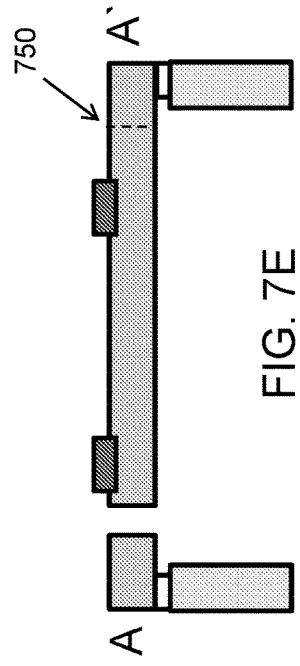

One preferred method of releasing gages that are attached to the frame, is illustrated in FIGS. 7A to 7E. The shown sequence may be effectuated on a wafer level, or the wafer may be diced, or cleaved, into smaller pieces. FIG. 7A shows the cross-sectional view of one strain gage after the gages have been fabricated on a device layer of a SOI wafer. The fabrication has been described in FIGS. 3 and 4. In order to protect the strain gages and pads during the release process, the strain gages and pads may preferably be passivated, as shown in FIG. 7B. One preferred passivation material 710, is black wax from Apiezon. Other materials may alternatively be employed. The passivation material may be melted and attached to a stainless steel plate or any other inert material 720 that is not attacked by the removal process of the SOI handle wafer 730. The steel plate serves as mechanical support and is not needed when alternative, firmer, passivation layers, such as polyimides, are used.

Figure 7C:
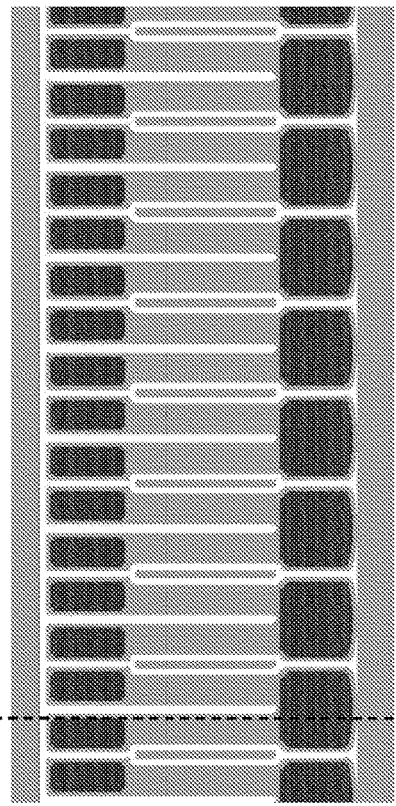

FIG. 7C illustrates the removal of the handle wafer. A typical method that may be employed is using a wet etchants such as Potassium Hydroxide or HNA mixtures. Those etchants are etching the handle wafer at a rate that is much larger than the etch rate of the BOX 740. However, other known methods may alternatively be employed. As illustrated in FIG. 7D, the BOX layer is removed, for example, by using a buffered hydrofluoric acid solution, which does not attack the exposed gages.

The final step is shown in FIG. 7E, wherein the gages are freed from the passivation layer and the carrier material. A preferred method is by immersion into solvents, such as Xylene, Acetone and Methanol. However, other methods may alternatively be employed. As shown, the gages are still attached to the frame of the device layer and the location of the attachment 750 creates a mechanical stress point that breaks off when plugged, e.g. with vacuum tweezers.

Preferred embodiments have been used to describe the present invention. However, persons familiar in the art will understand that variations are possible within the scope of this invention. For example, different shape of gages may be made or alternative process steps, such as sinter temperature or etch solutions may be used. Nonetheless, it should be recognized that alterations may be made without departing from the scope and spirit of the invention. Consequently, the scope and spirit of the invention should be established by the appended claims and not limited by the specific embodiments described above.

The invention claimed is:

1. A method of manufacturing single element semiconductor strain gauges comprising:
   forming an electrically resistive element including at least two metallic pads on the element for electrical connection;
   fabricating the electrically resistive element by photo-lithographically patterning a device layer of a SOI wafer; and
   etching the device layer; wherein
   said metallic pads are generated on top of said electrically resistive element by photo-lithographically patterning; and
   attaching metal wires to said metallic pads for handling and attachment of said resistive elements to future objects; and
   freeing the electrically resistive element and wires completely from a substrate electrically as well as physically by etching a BOX and carrier wafer of the SOI wafer, wherein the electrically resistive element is completely detached from the substrate.

* * * * *